United States Patent
Ruby et al.

(10) Patent No.: US 7,388,454 B2
(45) Date of Patent: Jun. 17, 2008

(54) ACOUSTIC RESONATOR PERFORMANCE ENHANCEMENT USING ALTERNATING FRAME STRUCTURE

(75) Inventors: Richard C. Ruby, Menlo Park, CA (US); Ronald S. Fazzio, Loveland, CO (US); Hongjun Feng, Windsor, CO (US); Paul D. Bradley, Los Altos, CA (US)

(73) Assignee: Avago Technologies Wireless IP Pte Ltd, Singapore (SG)

( * ) Notice: Subject to any disclaimer, the term of this patent is extended or adjusted under 35 U.S.C. 154(b) by 205 days.

(21) Appl. No.: 11/159,753

(22) Filed: Jun. 23, 2005

(65) Prior Publication Data

US 2006/0071736 A1  Apr. 6, 2006

Related U.S. Application Data

(60) Provisional application No. 60/615,255, filed on Oct. 1, 2004.

(51) Int. Cl.
*H03H 9/13* (2006.01)
*H03H 9/15* (2006.01)
*H03H 9/54* (2006.01)

(52) U.S. Cl. .............. 333/187; 310/322; 310/335; 310/365

(58) Field of Classification Search ........ 333/187–189; 310/335; 29/25.35
See application file for complete search history.

(56) References Cited

U.S. PATENT DOCUMENTS

| | | |
|---|---|---|
| 3,174,122 A | 3/1965 | Fowler et al. |
| 3,189,851 A | 6/1965 | Fowler |
| 3,321,648 A | 5/1967 | Kolm |
| 3,422,371 A | 1/1969 | Poirier et al. |
| 3,568,108 A | 3/1971 | Poirier et al. |
| 3,582,839 A | 6/1971 | Pim et al. |
| 3,590,287 A | 6/1971 | Berlincourt et el. |
| 3,610,969 A | 10/1971 | Clawson et al. |
| 3,826,931 A | 7/1974 | Hammond |
| 3,845,402 A | 10/1974 | Nupp |
| 4,084,217 A | 4/1978 | Brandis et al. |
| 4,172,277 A | 10/1979 | Pinson |
| 4,272,742 A | 6/1981 | Lewis |
| 4,281,299 A | 7/1981 | Newbold |
| 4,320,365 A | 3/1982 | Black et al. |

(Continued)

FOREIGN PATENT DOCUMENTS

DE  10160617  6/2003

(Continued)

OTHER PUBLICATIONS

Auld, B.A., "Acoustic Resonators," Acoustic Fields and Waves in Solids, Second Edition, vol. II, pp. 250-259 (1990), Krieger Publishing Company, Malabar, Florida.

(Continued)

*Primary Examiner*—Barbara Summons

(57) ABSTRACT

Disclosed is an acoustic resonator that includes a substrate, a first electrode, a layer of piezoelectric material, a second electrode, and an alternating frame region. The first electrode is adjacent the substrate, and the first electrode has an outer perimeter. The piezoelectric layer is adjacent the first electrode. The second electrode is adjacent the piezoelectric layer and the second electrode has an outer perimeter. The alternating frame region is on one of the first and second electrodes.

14 Claims, 9 Drawing Sheets

U.S. PATENT DOCUMENTS

| | | | |
|---|---|---|---|
| 4,355,408 A | 10/1982 | Scarrott | |
| 4,456,850 A | 6/1984 | Inoue et al. | |
| 4,529,904 A | 7/1985 | Hattersley | |
| 4,625,138 A | 11/1986 | Ballato | |
| 4,719,383 A | 1/1988 | Wang et al. | |
| 4,798,990 A | 1/1989 | Henoch | |
| 4,836,882 A | 6/1989 | Ballato | |
| 4,841,429 A | 6/1989 | Mcclanahan et al. | |
| 4,906,840 A | 3/1990 | Zdeblick et al. | |
| 5,048,036 A | 9/1991 | Scifres et al. | |
| 5,048,038 A | 9/1991 | Brennan et al. | |
| 5,118,982 A | 6/1992 | Inoue et al. | |
| 5,129,132 A | 7/1992 | Zdeblick et al. | |
| 5,162,691 A | 11/1992 | Mariani et al. | |
| 5,241,209 A | 8/1993 | Sasaki | |
| 5,241,456 A | 8/1993 | Marcinkiewicz et al. | |
| 5,294,898 A | 3/1994 | Dworsky et al. | |
| 5,382,930 A | 1/1995 | Stokes et al. | |
| 5,384,808 A | 1/1995 | Van Brunt et al. | |
| 5,448,014 A | 9/1995 | Kong et al. | |
| 5,465,725 A | 11/1995 | Seyed-Boloforosh | |
| 5,587,620 A | 12/1996 | Ruby et al. | |
| 5,589,858 A | 12/1996 | Kadowaki et al. | |
| 5,594,705 A | 1/1997 | Connor et al. | |
| 5,671,242 A | 9/1997 | Takiguchi et al. | |
| 5,692,279 A | 12/1997 | Mang et al. | |
| 5,714,917 A | 2/1998 | Ella | |
| 5,853,601 A | 12/1998 | Krishaswamy et al. | |
| 5,864,261 A | 1/1999 | Weber | |
| 5,872,493 A | 2/1999 | Ella | |
| 5,873,153 A | 2/1999 | Ruby et al. | |
| 5,873,154 A | 2/1999 | Ylilammi et al. | |
| 5,894,647 A | 4/1999 | Lakin | |
| 5,910,756 A | 6/1999 | Ella | |
| 5,936,150 A | 8/1999 | Kobrin et al. | |
| 5,953,479 A | 9/1999 | Zhou et al. | |
| 5,982,297 A | 11/1999 | Welle | |
| 6,040,962 A | 3/2000 | Kanazawa | |
| 6,060,818 A | 5/2000 | Ruby et al. | |
| 6,087,198 A | 7/2000 | Panasik | |
| 6,107,721 A | 8/2000 | Lakin | |
| 6,111,480 A | 8/2000 | Iyama et al. | |
| 6,124,756 A | 9/2000 | Yaklin et al. | |
| 6,150,703 A * | 11/2000 | Cushman et al. | 257/415 |
| 6,187,513 B1 | 2/2001 | Katakura | |
| 6,215,375 B1 | 4/2001 | Larson, III et al. | |
| 6,228,675 B1 | 5/2001 | Ruby et al. | |
| 6,229,247 B1 | 5/2001 | Bishop | |
| 6,252,229 B1 | 6/2001 | Hays et al. | |
| 6,262,600 B1 | 7/2001 | Haigh et al. | |
| 6,262,637 B1 | 7/2001 | Bradley et al. | |
| 6,265,246 B1 | 7/2001 | Ruby et al. | |
| 6,278,342 B1 | 8/2001 | Ella | |
| 6,292,336 B1 | 9/2001 | Cheng | |
| 6,307,447 B1 | 10/2001 | Barber et al. | |
| 6,307,761 B1 | 10/2001 | Nakagawa | |
| 6,376,280 B1 | 4/2002 | Ruby et al. | |
| 6,377,137 B1 | 4/2002 | Ruby | |
| 6,384,697 B1 | 5/2002 | Ruby | |
| 6,407,649 B1 | 6/2002 | Tikka et al. | |
| 6,414,569 B1 | 7/2002 | Nakafuku | |
| 6,420,820 B1 | 7/2002 | Larson, III | |
| 6,424,237 B1 | 7/2002 | Ruby et al. | |
| 6,429,511 B2 | 8/2002 | Ruby et al. | |
| 6,434,030 B1 | 8/2002 | Rehm et al. | |
| 6,437,482 B1 | 8/2002 | Akihiko | |
| 6,441,539 B1 | 8/2002 | Kitamura et al. | |
| 6,462,631 B2 | 10/2002 | Bradley et al. | |
| 6,466,105 B1 | 10/2002 | Lobl et al. | |
| 6,466,418 B1 | 10/2002 | Horng | |
| 6,469,597 B2 | 10/2002 | Ruby et al. | |
| 6,472,954 B1 | 10/2002 | Ruby et al. | |
| 6,476,536 B1 | 11/2002 | Pensala | |
| 6,479,320 B1 | 11/2002 | Gooch | |
| 6,483,229 B2 | 11/2002 | Ylilammi et al. | |
| 6,486,751 B1 | 11/2002 | Barber et al. | |
| 6,489,688 B1 | 12/2002 | Baumann et al. | |
| 6,492,883 B2 | 12/2002 | Liang et al. | |
| 6,507,983 B1 | 1/2003 | Ruby et al. | |
| 6,515,558 B1 | 2/2003 | Ylilammi | |
| 6,518,860 B2 * | 2/2003 | Ella et al. | 333/189 |
| 6,525,996 B1 | 2/2003 | Miyazawa | |
| 6,530,515 B1 | 3/2003 | Glenn et al. | |
| 6,534,900 B2 | 3/2003 | Aigner et al. | |
| 6,542,055 B1 | 4/2003 | Frank et al. | |
| 6,548,942 B1 | 4/2003 | Panaski | |
| 6,550,664 B2 | 4/2003 | Bradley et al. | |
| 6,564,448 B1 | 5/2003 | Oura et al. | |
| 6,566,979 B2 | 5/2003 | Larson et al. | |
| 6,583,374 B2 | 6/2003 | Knieser et al. | |
| 6,583,688 B2 | 6/2003 | Klee et al. | |
| 6,593,870 B2 | 7/2003 | Dummermuth et al. | |
| 6,600,390 B2 | 7/2003 | Frank | |
| 6,601,276 B2 | 8/2003 | Barber | |
| 6,617,249 B2 | 9/2003 | Ruby et al. | |
| 6,617,750 B2 | 9/2003 | Dummermuth et al. | |
| 6,630,753 B2 | 10/2003 | Malik et al. | |
| 6,635,509 B1 | 10/2003 | Ouellet | |
| 6,639,872 B1 | 10/2003 | Rein | |
| 6,651,488 B2 | 11/2003 | Larson et al. | |
| 6,657,363 B1 | 12/2003 | Aigner | |
| 6,668,618 B2 | 12/2003 | Larson et al. | |
| 6,670,866 B2 | 12/2003 | Ella et al. | |
| 6,693,500 B2 | 2/2004 | Yang et al. | |
| 6,710,508 B2 | 3/2004 | Ruby et al. | |
| 6,710,681 B2 | 3/2004 | Figueredo et al. | |
| 6,714,102 B2 | 3/2004 | Ruby et al. | |
| 6,720,844 B1 | 4/2004 | Lakin | |
| 6,720,846 B2 | 4/2004 | Iwashita et al. | |
| 6,724,266 B2 | 4/2004 | Plazza et al. | |
| 6,774,746 B2 | 8/2004 | Whatmore et al. | |
| 6,777,263 B1 | 8/2004 | Gan et al. | |
| 6,787,048 B2 | 9/2004 | Bradley et al. | |
| 6,788,170 B1 | 9/2004 | Kaitila et al. | |
| 6,803,835 B2 | 10/2004 | Frank | |
| 6,812,619 B1 | 11/2004 | Kaitila et al. | |
| 6,828,713 B2 | 12/2004 | Bradley et al. | |
| 6,842,088 B2 | 1/2005 | Yamada et al. | |
| 6,873,065 B2 | 3/2005 | Haigh et al. | |
| 6,873,529 B2 | 3/2005 | Ikuta | |
| 6,874,211 B2 | 4/2005 | Bradley et al. | |
| 6,874,212 B2 | 4/2005 | Larson, III | |
| 6,888,424 B2 | 5/2005 | Takeuchi et al. | |
| 6,900,705 B2 | 5/2005 | Nakamura et al. | |
| 6,903,452 B2 | 6/2005 | Ma et al. | |
| 6,906,451 B2 | 6/2005 | Yamada | |
| 6,911,708 B2 | 6/2005 | Park | |
| 6,917,261 B2 | 7/2005 | Unterberger | |
| 6,924,583 B2 | 8/2005 | Lin et al. | |
| 6,924,717 B2 | 8/2005 | Ginsburg et al. | |
| 6,927,651 B2 | 8/2005 | Larson, III et al. | |
| 6,936,928 B2 | 8/2005 | Hedler et al. | |
| 6,936,954 B2 | 8/2005 | Peczalski | |
| 6,946,928 B2 | 9/2005 | Larson et al. | |
| 6,954,121 B2 | 10/2005 | Bradley et al. | |
| 6,963,257 B2 | 11/2005 | Ella et al. | |
| 6,975,183 B2 | 12/2005 | Aigner et al. | |
| 6,977,563 B2 * | 12/2005 | Komuro et al. | 333/187 |
| 6,985,052 B2 | 1/2006 | Tikka | |
| 6,987,433 B2 | 1/2006 | Larson et al. | |
| 6,989,723 B2 | 1/2006 | Komuro et al. | |
| 6,998,940 B2 | 2/2006 | Metzger | |
| 7,019,604 B2 * | 3/2006 | Gotoh et al. | 333/187 |
| 7,019,605 B2 | 3/2006 | Larson et al. | |

| | | |
|---|---|---|
| 7,057,476 B2 | 6/2006 | Hwu |
| 7,084,553 B2 | 8/2006 | Ludwiczak |
| 7,091,649 B2 | 8/2006 | Larson |
| 7,098,758 B2 | 8/2006 | Wang et al. |
| 7,170,215 B2 | 1/2007 | Namba et al. |
| 7,173,504 B2 | 2/2007 | Larson |
| 7,187,254 B2 | 3/2007 | Su et al. |
| 7,230,509 B2 | 6/2007 | Stoemmer |
| 2002/0000646 A1 | 1/2002 | Gooch et al. |
| 2002/0030424 A1 | 3/2002 | Iwata |
| 2002/0121944 A1 | 9/2002 | Larson, III et al. |
| 2002/0121945 A1 | 9/2002 | Ruby et al. |
| 2002/0152803 A1 | 10/2002 | Larson, III et al. |
| 2002/0190814 A1 | 12/2002 | Yamada et al. |
| 2003/0001251 A1 | 1/2003 | Cheever et al. |
| 2003/0006502 A1 | 1/2003 | Karpman |
| 2003/0087469 A1 | 5/2003 | Ma |
| 2003/0102776 A1 | 6/2003 | Takeda et al. |
| 2003/0111439 A1 | 6/2003 | Fetter et al. |
| 2003/0128081 A1 | 7/2003 | Ella et al. |
| 2003/0132493 A1 | 7/2003 | Kang et al. |
| 2003/0141946 A1 | 7/2003 | Ruby et al. |
| 2003/0179053 A1 | 9/2003 | Aigner et al. |
| 2004/0092234 A1 | 5/2004 | Pohjonen |
| 2004/0124952 A1 | 7/2004 | Tikka |
| 2004/0150293 A1 | 8/2004 | Unterberger |
| 2004/0150296 A1 | 8/2004 | Park et al. |
| 2004/0195937 A1 | 10/2004 | Matsubara et al. |
| 2004/0257172 A1 | 12/2004 | Schmidhammer et al. |
| 2004/0263287 A1 | 12/2004 | Ginsburg et al. |
| 2005/0012570 A1 | 1/2005 | Korden et al. |
| 2005/0023931 A1 | 2/2005 | Bouche et al. |
| 2005/0030126 A1 | 2/2005 | Inoue et al. |
| 2005/0036604 A1 | 2/2005 | Scott et al. |
| 2005/0057117 A1 | 3/2005 | Nakatsuka et al. |
| 2005/0057324 A1* | 3/2005 | Onishi et al. ............... 333/191 |
| 2005/0068124 A1 | 3/2005 | Stoemmer |
| 2005/0093396 A1 | 5/2005 | Larson et al. |
| 2005/0093653 A1 | 5/2005 | Larson, III |
| 2005/0093654 A1 | 5/2005 | Larson et al. |
| 2005/0093655 A1 | 5/2005 | Larson et al. |
| 2005/0093657 A1 | 5/2005 | Larson et al. |
| 2005/0093658 A1 | 5/2005 | Larson et al. |
| 2005/0093659 A1 | 5/2005 | Larson et al. |
| 2005/0104690 A1 | 5/2005 | Larson |
| 2005/0110598 A1 | 5/2005 | Larson, III |
| 2005/0128030 A1 | 6/2005 | Larson et al. |
| 2005/0140466 A1 | 6/2005 | Larson, III et al. |
| 2005/0167795 A1 | 8/2005 | Higashi |
| 2005/0193507 A1 | 9/2005 | Ludwiczak |
| 2005/0206271 A1 | 9/2005 | Higuchi et al. |
| 2005/0218488 A1 | 10/2005 | Matsuo |
| 2006/0087199 A1 | 4/2006 | Larson et al. |
| 2006/0103492 A1 | 5/2006 | Feng et al. |
| 2006/0132262 A1 | 6/2006 | Fazzio et al. |
| 2006/0164183 A1 | 7/2006 | Tikka |
| 2006/0185139 A1 | 8/2006 | Larson, III et al. |
| 2007/0084964 A1 | 4/2007 | John et al. |
| 2007/0085447 A1 | 4/2007 | Larson |
| 2007/0085631 A1 | 4/2007 | Larson et al. |
| 2007/0085632 A1 | 4/2007 | Larson et al. |
| 2007/0086080 A1 | 4/2007 | Larson et al. |
| 2007/0086274 A1 | 4/2007 | Nishimura et al. |
| 2007/0090892 A1 | 4/2007 | Larson |
| 2007/0170815 A1 | 7/2007 | Unkrich |
| 2007/0171002 A1 | 7/2007 | Unkrich |

FOREIGN PATENT DOCUMENTS

| | | |
|---|---|---|
| EP | 0865157 | 9/1998 |
| EP | 0880227 | 11/1998 |
| EP | 0 973 256 | 1/2000 |
| EP | 1047189 | 10/2000 |
| EP | 1100196 | 11/2000 |
| EP | 1 096 259 | 5/2001 |
| EP | 1 180 494 | 7/2001 |
| EP | 1 249 932 | 10/2002 |
| EP | 1 258 989 | 11/2002 |
| EP | 1 258 990 | 11/2002 |
| EP | 1542362 | 6/2003 |
| EP | 1 517 443 | 3/2005 |
| EP | 1517444 | 3/2005 |
| EP | 1528674 | 5/2005 |
| EP | 1528675 | 5/2005 |
| EP | 1528677 | 5/2005 |
| EP | 1557945 | 7/2005 |
| EP | 1 575 165 | 9/2005 |
| GB | 1207974 | 10/1970 |
| GB | 2411239 | 8/2005 |
| GB | 2 418 791 | 4/2006 |
| JP | 2002/217676 | 8/2002 |
| WO | WO-98/16957 | 4/1998 |
| WO | WO-2005/043752 | 5/2000 |
| WO | WO 01/06647 | 1/2001 |
| WO | WO 01/99276 A1 | 12/2001 |
| WO | WO 02/103900 | 12/2002 |
| WO | WO-03/030358 | 4/2003 |
| WO | WO 03/043188 | 5/2003 |
| WO | WO-03/050950 | 6/2003 |
| WO | WO-03/058809 | 7/2003 |
| WO | WO-2004/034579 | 4/2004 |
| WO | WO 2004/051744 | 6/2004 |
| WO | WO-2005/043753 | 5/2005 |
| WO | WO-2005/043756 | 5/2005 |

OTHER PUBLICATIONS

A partiál copy of GB Search Report for Application No. GB0522393.8 mailed Jan. 9, 2006 (4 pgs.).

U.S. Appl. No. 10/971,169, filed Oct. 22, 2004, John D. Larson, III et al.

Holzlohner, Ronald et al., "Accurate Calculation of Eye Diagrams and Bit Error Rates in Optical Transmission Systems Using Linearization", *Journal of Lightwave Technology*, vol. 20, No. 3,, (Mar. 2002),pp. 389-400.

Reinhardt, Alexandre et al., "Design of Coupled Resonator Filters Using Admittance and Scattering Matrices", *2003 IEEE Ultrasonics Symposium*, (May 3, 2003),1428-1431.

"Search Report for Great Britain Patent Application", *No. 0617742. 2*, (Dec. 13, 2006).

"Search Report in the Great Britain Patent Application", *No. 0619698.4*, (Nov. 30, 2006).

Ruby, R. et al., "The Effect of Perimeter Geometry on FBAR Resonator Electrical Performance", *Microwave Symposium Digest, 2005 IEEE MTT-S International*, (Jun. 12, 2005),217-221.

"Search Report from corresponding application", *No. GB0605225. 2*, (Jun. 26, 2006).

Li, Yunxiu et al., "AC-DC Converter with Worldwide Range Input Voltage by Series and Parallel Piezoelectric Transformer Connection", *35th Annual IEEE Power Electronics Specialists Conference*, (2004).

Choi, Sungjin et al., "Design of Half-Bridge Piezo-Transformer Converters in the AC Adapter Applications", *IEEE 2005*, 244-248.

Ivensky, Gregory et al., "A Comparison of Piezoelectric Transformer AC/DC Converters with Current Doubler and voltage Doubler Rectifiers", *IEEE Transactions on Power Electronics*, vol. 19, No. 6., (Nov. 2004).

Navas, J. et al., "Miniaturised Battery Charger using Piezoelectric Transformers", *IEEE*, (2001),492-496.

Jiang, Yimin et al., "A Novel Single-Phase Power Factor Correction Scheme", *IEEE*, (1993),287-292.

Lakin, K.M. "Coupled Resonator Filters", *2002 IEEE Ultrasonics Symposium*, (Mar. 2, 2002),901-908.

Lakin, K.M. et al., "High Performance Stacked Crystal Filters for GPS and Wide Bandwidth Applications", *2001 IEEE Ultrasonics Symposium*, (Jan. 1, 2001),833-838.

Krishnaswamy, S.V. et al., "Film Bulk Acoustic Wave Resonator Technology", (May 29, 1990),529-536.

Lobl, H.P. et al., "Piezoelectric Materials For BAW Resonators And Filters", *2001 IEEE Ultrasonics Symposium*, (Jan. 1, 2001),807-811.

Lakin, K.M. "Bulk Acoustic Wave Coupled Resonator Filters", *2002 IEEE International Frequency Control Symposium and PDA Exibition*, (Jan. 2, 2002),8-14.

Jung, Jun-Phil et al., "Experimental And Theoretical Investigation On The Relationship Between AIN Properties And AIN-Based FBAR Characteristics", *2003 IEEE International Frequency Control Symposium and PDA Exhibition Jointly with the 17th European Frequency and Time Forum*, (Sep. 3, 2003),779-784.

Yang, C.M. et al., "Highly C Axis Oriented AIN Film Using MOCVD For 5GHx Band FBAR Filter", *2003 IEEE Ultrasonics Symposium*, (Oct. 5, 2003),pp. 170-173.

Martin, Steven J., et al., "Development Of A Low Dielectric Constant Polymer For The Fabrication Of Integrated Circuit Interconnect", *12 Advanced Materials*, (Dec. 23, 2000),1769-1778.

Hadimioglu, B. et al., ""Polymer Films As Acoustic Matching Layers".", *1990 IEEE Ultrasonics Symposium Proceedings*, vol. 3 PP., [Previously submitted as "Polymer Files As Acoustic Matching Layers, 1990 IEEE Ultrasonics Symposium Proceeding. vol. 4 pp. 1227-1340, Dec. 1990". Considered by Examiner on Dec. 20, 2007,(Dec. 1990),1337-1340.

"Examination Report from UK for application", GB 0605971.1, (Aug. 24, 2006).

"Search Report from corresponding application No.", GB 0605779.8, (Aug. 23, 2006).

"Examination report corresponding to application No.", GB0605770.7, (Aug. 25, 2006).

"Examination Report corresponding to application No.", GB0605775.6, (Aug. 30, 2006).

"Search report from corresponding application No.", GB0620152.9, (Nov. 15, 2006).

"Search report from corresponding application No.", GB0620655.1, (Nov. 17, 2006).

"Search report from corresponding application No.", GB0620653.6, (Nov. 17, 2006).

"Search Report from corresponding application No.", GB0620657.7, (Nov. 23, 2006).

Coombs, Clyde F., et al., "Electronic Instrument Handbook", *Second Edition, McGraw-Hill, Inc.*, (1995),pp. 5.1 to 5.29.

"British Search Report Application No.", 0605222.9, (Jul. 11, 2006).

Tiersten, H. F., et al., "An Analysis of Thiskness-Extensional Trapped Energy Resonant Device Structures with Rectangular Electrodes in the Piezoelectric Thin Film on Siliconn Configuration", *J. Appl. Phys.* 54 (10), (Oct. 1983),5893-5910.

Schuessler, Hans H., "Ceramic Filters and Resonators", *Reprinted from IEEE Trans. Sonics Ultrason.*, vol. SU-21, (Oct. 1974),257-268.

Fattinger, G. G., et al., "Coupled Bulk Acoustic Wave Resonator Filters: Key technology for single-to-balanced RF filters", *0-7803-8331-1/4/W20.00; IEEE MTT-S Digest*, (2004),927-929.

"Search Report for Great Britain Patent Application", No. 0617742.2, (Mar. 29, 2007).

"A partial copy of GB Search Report for Application No.", GB0525884.3, (Feb. 2, 2006),4 pgs.

* cited by examiner ic Resonator Performance Enhancement Using Alternating Frame Structure

CROSS-REFERENCE TO RELATED APPLICATIONS

This Patent Application is related to U.S. Pat. No. 7,161,448, filed on Jun. 14, 2004, entitled "ACOUSTIC RESONATOR PERFORMANCE ENHANCEMENT USING SELECTIVE METAL ETCH;" to Utility Patent Application Ser. No. 11/100,311, filed on Apr. 6, 2005, entitled "ACOUSTIC RESONATOR PERFORMANCE ENHANCEMENT USING FILLED RECESSED REGION;" to Provisional Patent Application Ser. No. 60/615,255, filed on Oct. 1, 2004, entitled "A THIN FILM BULK ACOUSTIC RESONATOR WITH A MASS LOADED PERIMETER; and to Utility Patent Application Ser. No. 10/990,201, filed on Nov. 15, 2004, entitled A THIN FILM BULK ACOUSTIC RESONATOR WITH A MASSED PERIMETER, and is commonly assigned to the same assignee as the present invention.

BACKGROUND

The need to reduce the cost and size of electronic equipment has created a need for smaller single filtering elements. Thin-Film Bulk Acoustic Resonators (FBARs) and Stacked Thin-Film Bulk Wave Acoustic Resonators (SBARs) represent one class of filter elements with potential for meeting these needs. These filters can collectively be referred to as FBARs. An FBAR is an acoustic resonator that uses bulk longitudinal acoustic waves in thin-film piezoelectric (PZ) material. Typically, an FBAR includes a layer of PZ material sandwiched between two metal electrodes. The combination PZ material and electrodes are suspended in air by supporting the combination around its perimeter or are placed over an acoustic mirror.

When an electrical field is created between the two electrodes, the PZ material converts some of the electrical energy into mechanical energy in the form of acoustic waves. The acoustic waves propagate generally in the same direction as the electric field and reflect off the electrode-air or electrode-acoustic mirror interface at some frequency, including at a resonance frequency. At the resonance frequency, the device can be used as an electronic resonator. Multiple FBARs can be combined such that each is an element in RF filters.

Ideally, the resonant energy in the filter elements is entirely "trapped" in the resonator. In practice, however, dispersive modes exist. These modes can result in a decreased quality factor (Q) for the filter.

For these and other reasons, a need exists for the present invention.

SUMMARY

One aspect of the present invention provides an acoustic resonator that includes a substrate, a first electrode, a layer of piezoelectric material, a second electrode, and an alternating frame region. The first electrode is adjacent the substrate, and the first electrode has an outer perimeter. The piezoelectric layer is adjacent the first electrode. The second electrode is adjacent the piezoelectric layer and the second electrode has an outer perimeter. The alternating frame region is on one of the first and second electrodes.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
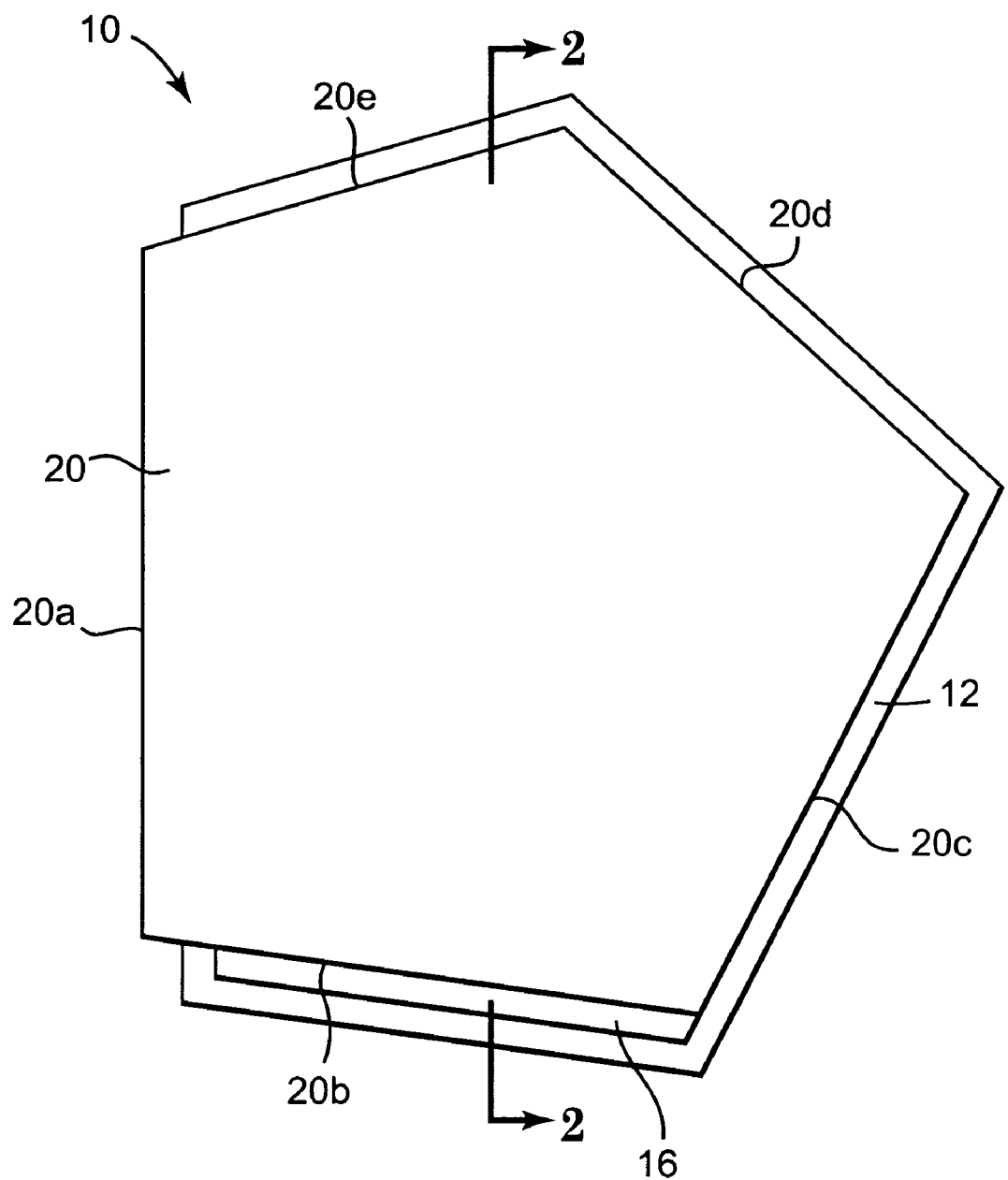
FIG. 1 illustrates a top plan view of an FBAR.
Figure 2:
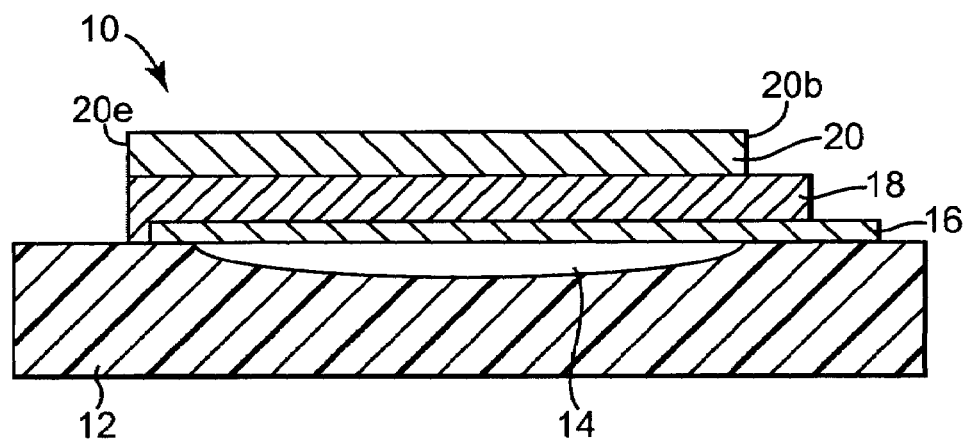
FIG. 2 illustrates a cross-sectional view of an FBAR.

FIGS. 1 and 2 illustrate top and cross-sectional views, respectively, of FBAR 10. FBAR 10 includes substrate 12, depression 14, first electrode 16, piezoelectric (PZ) layer 18, and second electrode 20. In FIG. 1, PZ layer 18 and depression 14 are hidden from view. Second electrode 20 has a perimeter that is illustrated in FIG. 1 as pentagon-shaped, having edges 20a, 20b, 20c, 20d and 20e. Two edges, 20b and 20e, are illustrated in the cross-sectional view of FIG. 2. Typically, contacts (not illustrated) are coupled to first electrode 16 and to second electrode 20 and a passivation layer (not illustrated) may cover top electrode 20. The contacts facilitate connecting the first and second electrodes 16 and 20 to a source of voltage.

First electrode 16, PZ layer 18, and second electrode 20 collectively form an FBAR membrane. The FBAR membrane is adjacent substrate 12 and suspended over depression 14 to provide an electrode-air interface. In one embodiment, depression 14 is created by etching away a portion of substrate 12. Depression 14 is deep enough so that sufficient electrode-air interface is created under the FBAR membrane.

In an alternative embodiment, the FBAR membrane may be placed adjacent an acoustic mirror (not illustrated in FIGS. 1 and 2) formed within substrate 12. In this way, an electrode-acoustic mirror interface is formed. The resonator thus formed is a Solid Mounted Resonator (SMR).

In one embodiment, substrate 12 is made of silicon (Si) and PZ layer 18 is made from aluminum nitride (AlN). Alternatively, other piezoelectric materials may be used for PZ layer 18. In one embodiment, first and second electrode 16 and 20 may be made of molybdenum (Mo). Alternatively, other materials may be used for the electrodes. In one embodiment, the contacts may be made of gold (Au). Alternatively, other materials may be used for the contacts.

FBAR 10 illustrated in FIGS. 1 and 2 is configured to use longitudinal or shear acoustic waves propagating in PZ layer 18. An electric field is created between first and second electrodes 16 and 20 via an impressed voltage. The piezo-electric material of PZ layer 18 then converts some of the electrical energy into mechanical energy in the form of acoustic waves. So configured, FBAR 10 exhibits dispersive modes resulting in a quality factor (Q) loss for FBAR 10.

Figure 3:
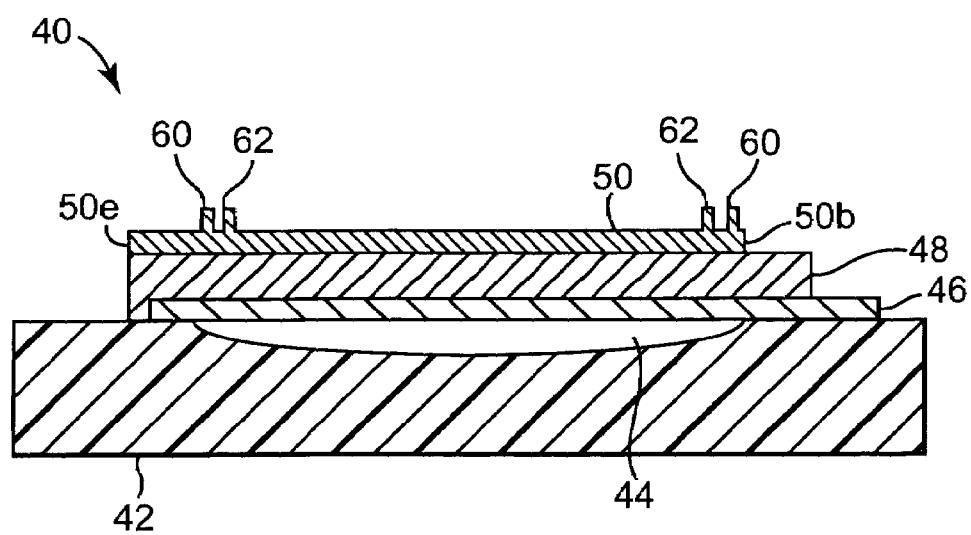
FIG. 3 illustrates a cross-sectional view of an FBAR with an alternating frame region according to one embodiment of the present invention.

FIG. 3 illustrates a cross-sectional view of FBAR 40 in accordance with one embodiment of the present invention. FBAR 40 includes substrate 42, depression 44, first electrode 46, piezoelectric (PZ) layer 48, second electrode 50 first frame 60 and second frame 62. Typically, contacts (not illustrated in FIG. 3) are coupled to first and second electrodes 46 and 50, and a passivation layer typically covers the second electrode (also not illustrated in FIG. 3). The contacts facilitate connecting first and second electrodes 46 and 50 to a voltage source. First electrode 46, PZ layer 48, and second electrode 50 collectively form an FBAR membrane, which may be placed over a depression 44 or over an acoustic mirror as discussed above. The FBAR membrane is illustrated adjacent substrate 42 and suspended over depression 44 to provide an electrode-air interface. As with previous embodiments, an electrode-acoustic mirror interface is also obtainable using an SMR design in accordance with the present invention.

Second electrode 50 and the other layers of the FBAR membrane have a perimeter that can be of various configurations. For example, the perimeters of each can be pentagon-shaped, similar to FBAR 10 above. They could also be any of various polygonal shapes, circular, or various irregular shapes. The cross-sectional view illustrated in FIG. 3 illustrates two locations along the perimeter of second electrode 50, edges 50b and 50e. In one embodiment, an edge of PZ layer 48 is generally aligned with edges 50b and 50e of second electrode 50 in the vertical direction in FBAR 40 as illustrated in FIG. 3.

In FBAR 40 illustrated in FIG. 3, second electrode 50 includes first frame 60 and second frame 62 added around the perimeter of the electrode and shown adjacent edges 50b and 50e of second electrode 50. In one embodiment, first and second frames 60 and 62 are located just outside the perimeter of depression 44. In this way, when the perimeter or outside diameter of depression 44 is extended in the vertical direction (as oriented in the illustration of FIG. 3), first and second frames 60 and 62 are just "outside" the perimeter of depression 44. In other embodiments, first and second frames 60 and 62 overlap the perimeter of depression 44 such that portions of first and second frames 60 and 62 are "inside" and portions are "outside" the perimeter of depression 44. In other embodiments, first and second frames 60 and 62 are located just inside the perimeter of depression 44. In this way, when the perimeter or outside diameter of depression 44 is extended in the vertical direction (as oriented in the illustration of FIG. 3), first and second frames 60 and 62 are just "inside" the perimeter of depression 44.

First and second frames 60 and 62 form an alternating frame region. In the alternating frame region, first and second frames 60 and 62 are spaced apart in order to achieve a multiple periodic pattern consisting of the frames having spaces between them. In this way, a material having a first acoustic impedance (first frame 60) is followed by a region with different acoustic impedance (illustrated as air in FIG. 3). Second frame 62 spaced apart from first frame 60 adds another element to the periodic pattern with another interface of differing acoustic impedance. By building alternating regions of different impedances with the alternating frame region, certain wavelengths of signals within the FBAR membrane will reflect such that there is a phase change on some of the reflection. The alternating frame region is constructed such that all of the reflected wavelengths interfere to provide improved Q.

In one embodiment, this alternating frame region of first and second frames 60 and 62 further forms a distributed Bragg reflector (DBR) structure. In this way, the width (left to right in the illustration) of each of first and second frames 60 and 62 within the alternating frame region, as well as the widths of the areas of space between them, is roughly one-quarter wavelength of at least one of the lateral acoustic modes. In another embodiment, the width of each component of the periodic pattern is a multiple of one-quarter wavelength of at least one of the lateral acoustic modes. In one case, the width of each component of the periodic pattern is one-quarter wavelength of the dominant lateral mode. In this way, FBAR 40 with the alternating frame region structure performs as a high efficiency mirror.

In addition to the alternating frame region trapping certain modes, in some embodiments either first frame 60 or second frame 62 may also provide a thicker region at the outer edge of FBAR 40 (around the perimeter of the electrode and shown adjacent second electrode edges 50b and 50e) thereby providing more stiffness at that boundary. In this way, additional energy trapping occurs due to the effect of having a thicker frame at the edge.

In some embodiments, first frame 60 and/or second frame 62 is a material selected from the croup comprising dielectrics, metals, metal alloys. piezoelectrics, Mo, Pt, Al, Cu, W, Au, Ag, polyimide, benzocyclobutene (BCB), $SiO_2$, $Si_3N_4$, ZnO, $LiNbO_3$, PZT, $LiTaO_3$, and $Al_2O_3$.

Figure 4:
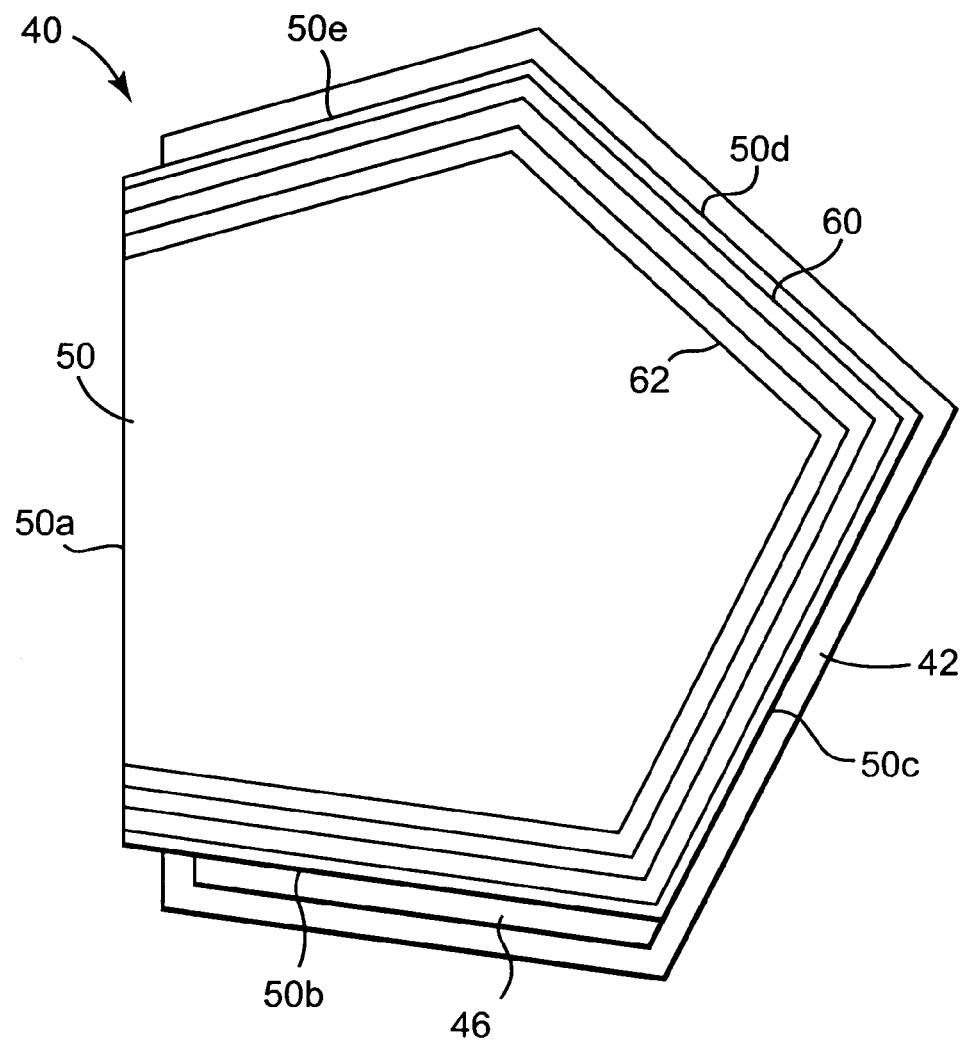
FIG. 4 illustrates a top plan view of one embodiment of the FBAR illustrated in FIG. 3.

FIG. 4 illustrates a plan view of FBAR 40 of FIG. 3 in accordance with an embodiment of the present invention. As illustrated in FIG. 4, FBAR 40 includes substrate 42, first electrode 46, and second electrode 50. In FIG. 4, piezoelectric (PZ) layer 48 and depression 44 are hidden from view. Typically, contacts (not illustrated in the Figures) are coupled to first and second electrodes 46 and 50, and a passivation layer (also not illustrated in the Figures) covers second electrode 50.

In FIG. 4, first and second frames 60 and 62 are illustrated extending adjacent the perimeter of second electrode 50. In FIG. 4, the perimeter of second electrode 50 is generally pentagon-shaped having five relatively straight edges (50a, 50b, 50c, 50d, and 50e), but in alternative embodiments can be essentially any polygonal shape, circular in shape, or have any other smooth or irregular shape.

In FIG. 4, first and second frames 60 and 62 are illustrated extending adjacent the perimeter of second electrode 50 along four of the five edges of the pentagon-shaped electrode, that is, adjacent edges 50b, 50c, 50d, and 50e. In one embodiment, a contact is attached to the fifth edge 50a of second electrode 50, so first and second frames 60 and 62 do not extend along that edge in that embodiment. In alternative embodiments, however, first and second frames 60 and 62 extend adjacent the perimeter of second electrode 50 along all of the five edges of the pentagon-shaped electrode, for example, adjacent edges 50a, 50b, 50c, 50d, and 50e.

As one skilled in the art will understand, any number of alternative first and second frames 60 and 62 can be provided adjacent the edges of second electrode 50 to form the alternating frame region consistent with the present invention. First and second frames 60 and 62 can be continuously extended along some or all of the edges of second electrode 50 as illustrated, first and second frames 60 and 62 can have smaller segments that are not continuous along the edge, and other shapes and configurations of first and second frames 60 and 62 can be used, especially where second electrode 50 is a shape other than a pentagon.

In addition to the alternating frame region having first and second frames 60 and 62 illustrated in FIGS. 3 and 4, multiple alternating frame structures may be employed. In some embodiments, each alternating frame structure forms a DBR structure having regions with widths that correspond to quarter wavelengths or multiples of quarter wavelengths of different lateral modes. These alternative embodiments can also be configured such that the reflected wavelengths interfere constructively to trap the primary and/or other lateral modes to produce an improved performing FBAR. In addition, they may be configured to provide stiffening at the edges of the FBAR providing further mode trapping thereby enhancing FBAR performance. In some embodiments, the alternating frame region has areas of thicknesses that extend above the electrode surface, followed by regions that have the same thickness as the electrode (see FIG. 3). In other embodiments, the alternating regions of the alternating frame structure have thicknesses that extend above the electrode surface, followed by regions that have thickness that is thinner than the electrode.

Figure 5:
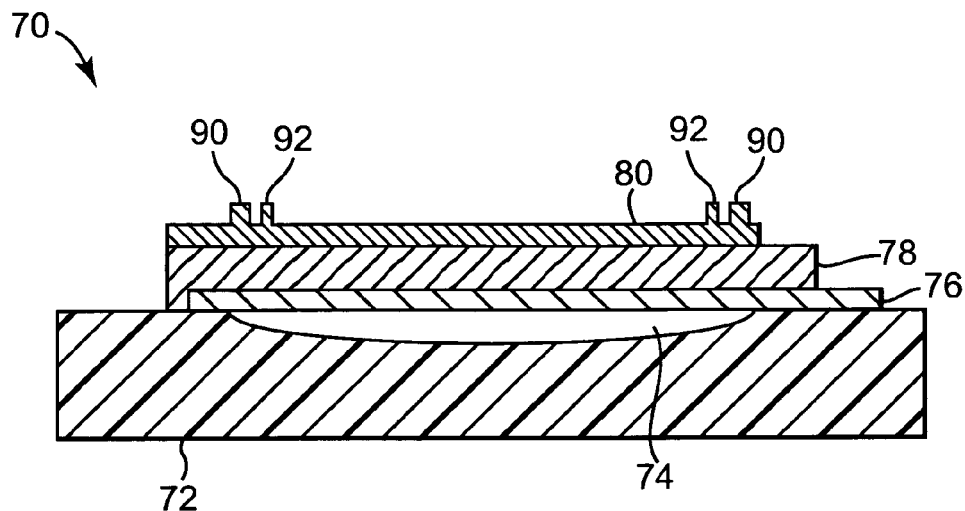
FIG. 5 illustrates a cross-sectional view of an FBAR with an alternating frame region according to one embodiment of the present invention.

FIG. 5 illustrates a cross-sectional view of FBAR 70 in accordance with an alternative embodiment of the present invention. FBAR 70 is similar to that illustrated in FIG. 3, and includes substrate 72, depression 74, first electrode 76, piezoelectric (PZ) layer 78, second electrode 80 and first and second frames 90 and 92.

In one embodiment, the performance of FBAR 70 as illustrated in FIG. 5 is similar to that described above for FBAR 40 as depicted in FIG. 3. In this way, first and second frames 90 and 92 form an alternating frame region. By building alternating regions of different acoustic impedance with the alternating frame region, certain wavelengths of signals within the FBAR membrane will reflect such that there is a phase change on some of the reflection. In one embodiment, all of the reflected wavelengths interfere to improve Q. In one embodiment, the alternating frame region of FBAR 70 is constructed as a DBR structure such that the width of each component of the alternating pattern is a multiple of one-quarter wavelength of at least one of the lateral acoustic modes.

In addition, first frame 90 is wider than second frame 92 in FBAR 70. Consequently, this wider region of first frame 90 provides more stiffness at the edge of FBAR 70 such that it acts like a hard boundary, thereby providing good energy trapping. This further improves the performance of FBAR 70.

Figure 6:
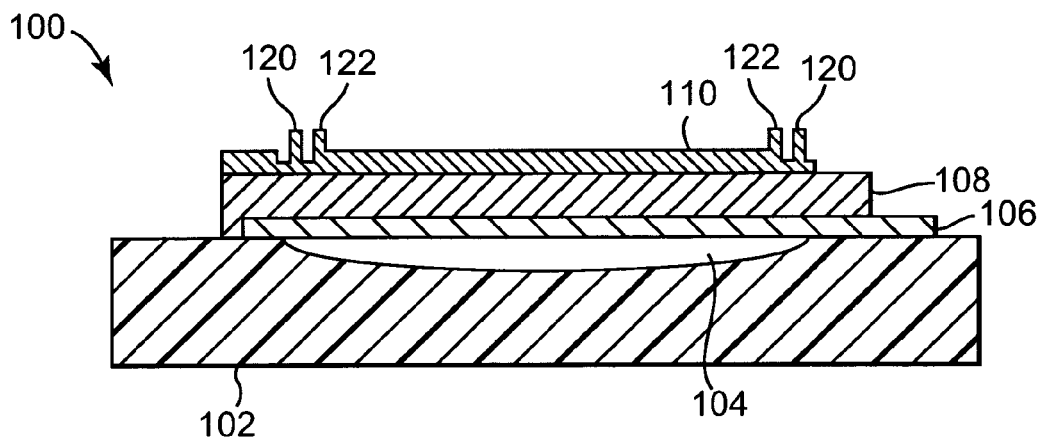
FIG. 6 illustrates a cross-sectional view of an FBAR with an alternating frame region according to another embodiment of the present invention.

FIG. 6 illustrates a cross-sectional view of an alternative FBAR 100 in accordance with one embodiment of the present invention. FBAR 100 is similar to those illustrated above, and includes substrate 102, depression 104, first electrode 106, piezoelectric (PZ) layer 108, second electrode 110 and first and second frames 120 and 122.

In one embodiment, the performance of FBAR 100 as illustrated in FIG. 6 is similar to those illustrated above, in that first and second frames 120 and 122 form an alternating frame region. By building alternating regions of different acoustic impedance with the alternating frame region (that is, frames 120 and 122 separated by air in the illustration), certain wavelengths of signals within the FBAR membrane will reflect such that there is a phase change on some of the reflection. The alternating frame region, in one embodiment, is constructed such that all of the reflected wavelengths interfere to improve Q of FBAR 100, thereby improving its performance. In one embodiment, the alternating frame region of FBAR 100 is constructed as a DBR structure.

In addition, first frame 120 and second frame 122 are separated by a region of second electrode 110 that is thinner than are the remaining portions of second electrode 110. Furthermore, frame 120 provides stiffness at the edge of FBAR 100 providing additional energy trapping, which further improves its performance.

Figure 7:
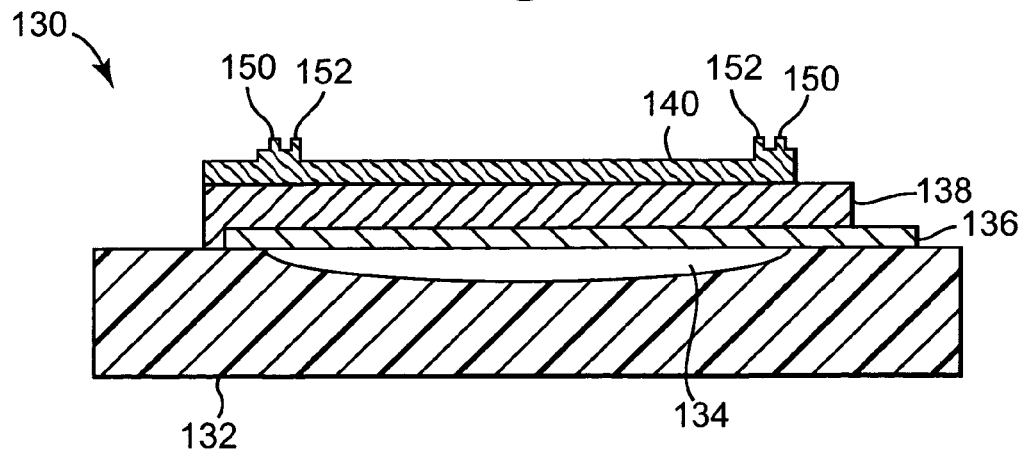
FIG. 7 illustrates a cross-sectional view of an FBAR with an alternating frame region according to another embodiment of the present invention.

FIG. 7 illustrates a cross-sectional view of an alternative FBAR 130 in accordance with one embodiment of the present invention. FBAR 130 is similar to those illustrated above, and includes substrate 132, depression 134, first electrode 136, piezoelectric (PZ) layer 138, second electrode 140 and first and second frames 150 and 152.

In one embodiment, the performance of FBAR 130 as illustrated in FIG. 7 is similar to those illustrated above, in that first and second frames 150 and 152 form an alternating frame region. By building alternating regions of different acoustic impedance with the alternating frame region (that is, frames 150 and 152 separated by air in the illustration), certain wavelengths of signals within the FBAR membrane will reflect such that there is a phase change on some of the reflection. The alternating frame region is constructed such that all of the reflected wavelengths interfere to improve Q of FBAR 130, thereby improving its performance. In one embodiment, the alternating frame region of FBAR 130 is constructed as a DBR structure.

In addition, first frame 150 and second frame 152 are separated by a region of second electrode 140 that is thicker than are the remaining portions of second electrode 140. Furthermore, frame 150 and the raised region (that is, raised relative to the surface of second electrode 140) between frames 150 and 152 provide stiffness at the edge of FBAR 130 providing additional energy trapping, which further improves its performance.

Figure 8:
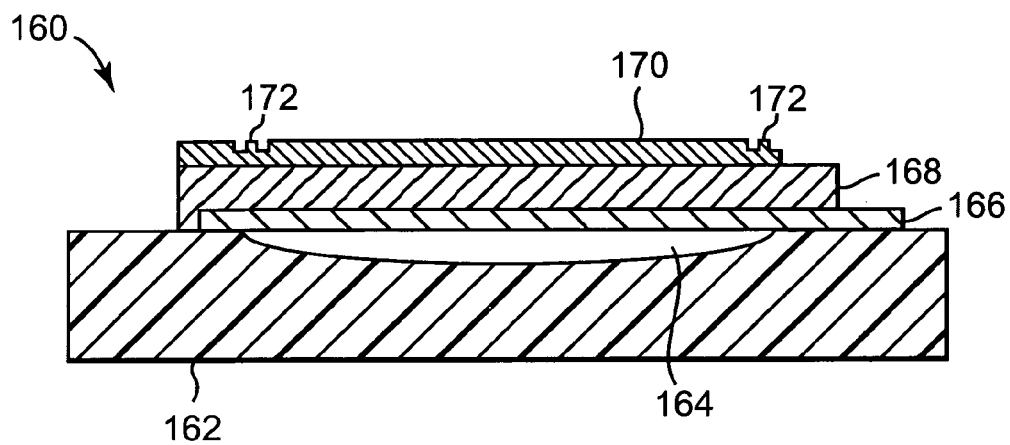
FIG. 8 illustrates a cross-sectional view of an FBAR with an alternating frame region according to one embodiment of the present invention.

FIG. 8 illustrates a cross-sectional view of an alternative FBAR 160 in accordance with one embodiment of the present invention. FBAR 160 is similar to those illustrated above, and includes substrate 162, depression 164, first electrode 166, piezoelectric (PZ) layer 168, second electrode 170 and frame 172.

In one embodiment, the performance of FBAR 160 as illustrated in FIG. 8 is similar to those illustrated above, in that frame 172, combined with adjacent recessed region on either side, forms an alternating frame region. By building alternating regions of different acoustic impedance with the alternating frame region (that is, frame 172 and recessed regions immediately adjacent frame 172 on either side in the illustration), certain wavelengths of signals within the FBAR membrane will reflect such that there is a phase change with some of the reflection. The alternating frame region is constructed such that all of the reflected wavelengths interfere to improve Q of FBAR 160 and improving its performance. In one embodiment, the alternating frame region of FBAR 160 is constructed as a DBR structure.

In addition, frame 172 is the same thickness as the remaining portions of second electrode 170, while the recessed regions immediately adjacent frame 172 are thinner than the remaining portions of second electrode 170. Furthermore, frame 172 provides stiffness at the edge of FBAR 160 providing additional energy trapping, which further improves its performance.

Figure 9:
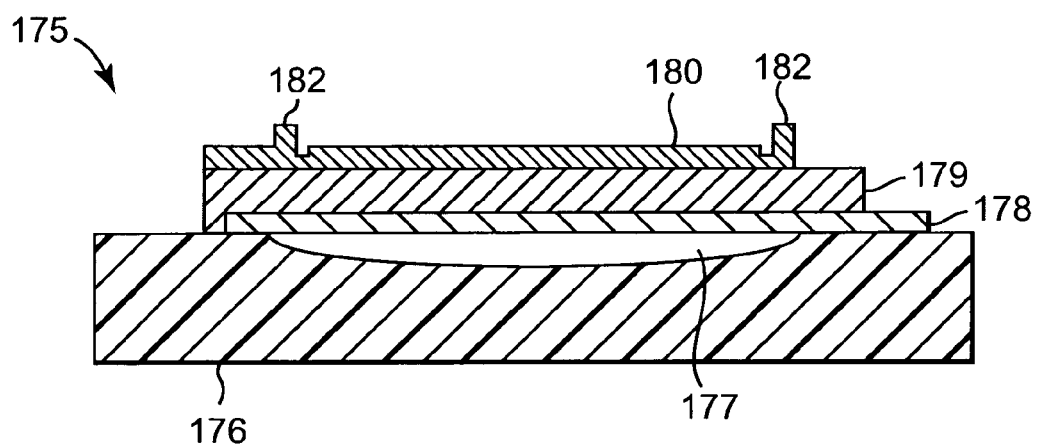
FIG. 9 illustrates a cross-sectional view of an FBAR with an alternating frame region according to one embodiment of the present invention.

FIG. 9 illustrates a cross-sectional view of an alternative FBAR 175 in accordance with one embodiment of the present invention. FBAR 175 is similar to those illustrated above, and includes substrate 176, depression 177, first electrode 178, piezoelectric (PZ) layer 179, second electrode 180 and frame 182.

In one embodiment, the performance of FBAR 175 as illustrated in FIG. 9 is similar to those illustrated above, in that frame 182, combined with adjacent recessed region on either side, forms an alternating frame region. By building alternating regions of different acoustic impedance with the alternating frame region (that is, frame 182 and recessed regions immediately adjacent frame 182 on either side in the illustration), certain wavelengths of signals within the FBAR membrane will reflect such that there is a phase change with some of the reflection. The alternating frame region is constructed such that all of the reflected wavelengths interfere to improve Q of FBAR 175 and improving its performance. In one embodiment, the alternating frame region of FBAR 175 is constructed as a DBR structure.

In addition, frame 182 is the thicker than the remaining portions of second electrode 180, while the recessed regions immediately adjacent frame 182 are thinner than the remaining portions of second electrode 180. Furthermore, frame 182 adjacent the recessed region provides stiffness at the edge of FBAR 175 providing additional energy trapping, which further improves its performance.

Figure 10:
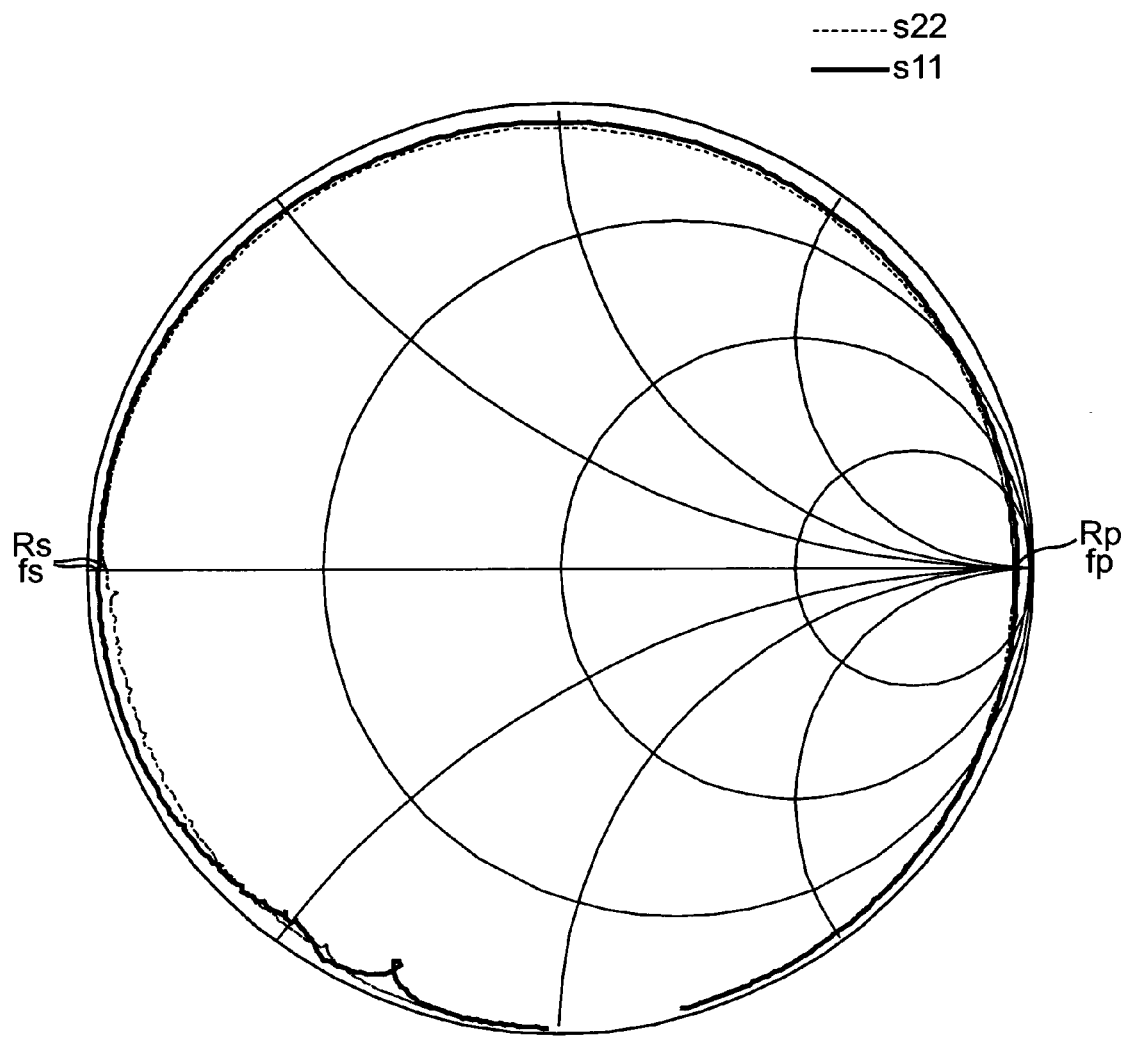
FIG. 10 illustrates Q circles for two exemplary FBARs plotted on a Smith chart.

FIG. 10 illustrates Q circles for two exemplary FBARs plotted on a Smith chart, and illustrates improvement in $R_p$ and therefore Q in one of the FBARs. As is known in the art, a Smith Chart is a polar plot of a complex impedance (used in FIG. 10 to illustrate measures of s11 and s22 scattering parameters). These s11 and s22 scattering parameters represent a ratio of complex amplitudes of backward and forward waves. The Smith Chart aids in translating the reflection coefficients into impedance and it maps part of the impedance placed into a unit circle.

The improved performance of FBAR 175 is demonstrated by the Q circles illustrated in FIG. 10. FIG. 10 illustrates the S-parameter measurements of an exemplary FBAR device, such as FBAR 175 with an alternating frame region. As illustrated, the alternating frame region of FBAR 175 (solid line labeled s11) has a much improved $R_p$ versus that of a control device, such as that illustrated in FIG. 2 (dashed line labeled s22) in the upper half of the chart.

Generally, the horizontal axis passing through the unit circle represents real impedance, the area above the axis represents inductive reactance and the area below represents capacitive reactance. The left-hand portion of the chart at zero reactance represents series resonance frequency (fs) and occurs where the Q circle crosses the real axes on the left side of the Smith Chart. The left-hand portion of the chart also demonstrates the parameter of resistance $R_s$. The right-hand portion of the chart at zero reactance represents parallel resonant frequency (fp) and occurs where the Q circle crosses the real axes on the right side of the Smith Chart. The right-hand portion of the chart also demonstrates the parameter of resistance $R_p$. The closer that a plot of FBAR filter characteristics on a Smith Chart is to the perimeter of the Smith Chart, the higher the Q will be for that FBAR. Also, the more smooth that the curve is, the lower the noise is in the FBAR.

In FIG. 10, the performance of FBAR 175 as a filter is illustrated by the solid line Q circle s11 and the performance of a prior art FBAR without an alternating frame region on the electrode is illustrated by the dashed line Q circle s22. As evident, FBAR 175 improves the quality of the filter near the frequency fp. FBAR 175, illustrated by Q circle s11, more closely approximates a unit circle in the upper half of the unit circle and is representative of a less lossy device in that area, which improves the performance of FBAR 175 when used in a filter.

Furthermore, there is also improvement in the lower half of the unit circle for FBAR 175 due to the recessed region inside the frame 182. Thus, FBAR 175 exhibits combined improvement ("closeness") of the Q-circle to the edge of the Smith Chart) at both an 8 o'clock position of the chart and at a 2 o'clock position of the chart.

Figure 11:
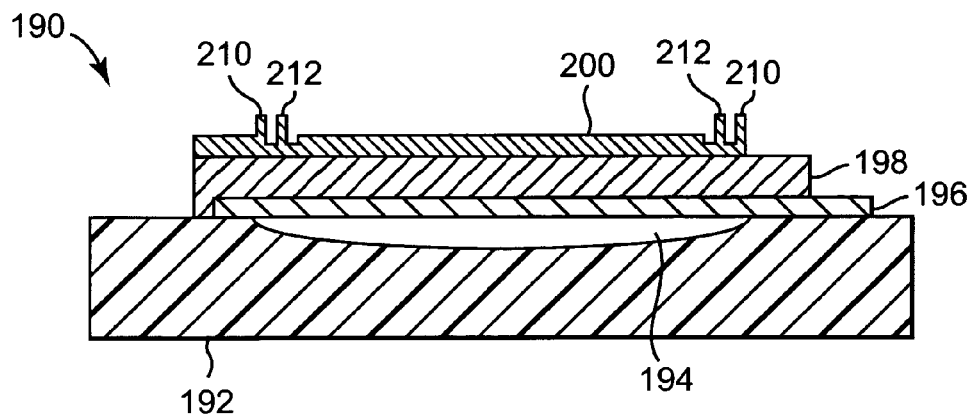
FIG. 11 illustrates a cross-sectional view of an FBAR with an alternating frame region according to another embodiment of the present invention.

FIG. 11 illustrates a cross-sectional view of an alternative FBAR 190 in accordance with one embodiment of the present invention. FBAR 190 is similar to those illustrated above, and includes substrate 192, depression 194, first electrode 196, piezoelectric (PZ) layer 198, second electrode 200 and first and second frames 210 and 212.

In one embodiment, the performance of FBAR 190 as illustrated in FIG. 11 is similar to those illustrated above, in that first and second frames 210 and 212 form an alternating frame region. By building alternating regions of different acoustic impedance with the alternating frame region (that is, frames 210 and 212 separated by air in the illustration), certain wavelengths of signals within the FBAR membrane will reflect such that there is a phase change on some of the reflection. The alternating frame region is constructed such that all of the reflected wavelengths interfere to improve Q of FBAR 190, thereby improving its performance. In one embodiment, the alternating frame region of FBAR 190 is constructed as a DBR structure.

In addition, first frame 210 and second frame 212 are separated by a region of second electrode 200 that is thinner than are the remaining portions of second electrode 200. An additional thinner recessed region is provided adjacent second frame 212 toward the center of FBAR 190. Furthermore, frame 210 provides stiffness at the edge of FBAR 190 providing additional energy trapping, which further improves its performance.

Figure 12:
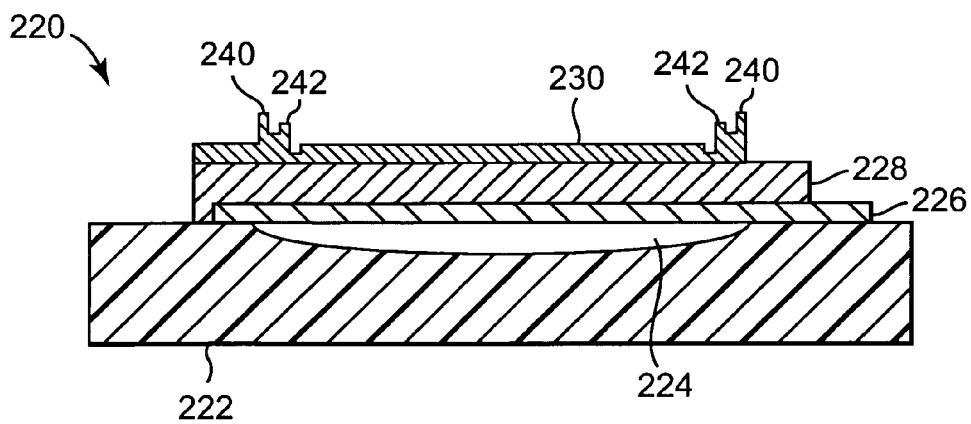
FIG. 12 illustrates a cross-sectional view of an FBAR with an alternating frame region according to another embodiment of the present invention.

FIG. 12 illustrates a cross-sectional view of an alternative FBAR 220 in accordance with one embodiment of the present invention. FBAR 220 is similar to those illustrated above, and includes substrate 222, depression 224, first electrode 226, piezoelectric (PZ) layer 228, second electrode 230 and first and second frames 240 and 242.

In one embodiment, the performance of FBAR 220 as illustrated in FIG. 12 is similar to those illustrated above, in that first and second frames 240 and 242 form an alternating frame region. By building alternating regions of different acoustic impedance with the alternating frame region (that is, frames 240 and 242 separated by air in the illustration), certain wavelengths of signals within the FBAR membrane will reflect such that there is a phase change on some of the reflection. The alternating frame region is constructed such that all of the reflected wavelengths interfere to improve Q of FBAR 220, thereby improving its performance. In one embodiment, the alternating frame region of FBAR 220 is constructed as a DBR structure.

In addition, first frame 240 and second frame 242 are separated by a region of second electrode 230 that is thicker than are the remaining portions of second electrode 230. An additional thinner recessed region is provided adjacent second frame 242 toward the center of FBAR 220. Furthermore, frame 240 provides stiffness at the edge of FBAR 220 providing additional energy trapping, which further improves its performance.

For each of the above-illustrated cross-sectional views of the various FBAR embodiments, various alternating frame regions are illustrated. One skilled in the art will understand that other combinations of relative thicknesses of the portions within the alternating frame regions are possible. For example, an alternating frame region can have a single recessed region followed by thicker frame, or several recessed and thicker frames may be alternated in the alternating frame region. In addition, each of the above-illustrated FBAR embodiments has alternating frame regions consisting of the same material as the second electrode. Other materials can also be used, however, as will be discussed below.

Figure 13:
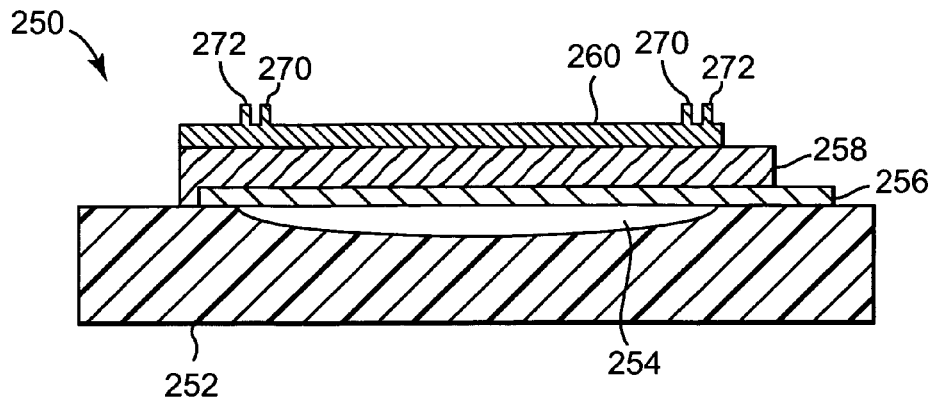
FIG. 13 illustrates a cross-sectional view of an FBAR with an alternating frame region according to one embodiment of the present invention.

FIG. 13 illustrates a cross-sectional view of an alternative FBAR 250 in accordance with one embodiment of the present invention. FBAR 250 is similar to those illustrated above, and includes substrate 252, depression 254, first electrode 256, piezoelectric (PZ) layer 258, second electrode 260 and first and second frames 270 and 272.

In one embodiment, the performance of FBAR 250 as illustrated in FIG. 13 is similar to those illustrated above, in that first and second frames 270 and 272 form an alternating frame region. By building alternating regions of different acoustic impedance with the alternating frame region (that is, frames 270 and 272 separated by air in the illustration), certain wavelengths of signals within the FBAR membrane will reflect such that there is a phase change on some of the reflection. The alternating frame region is constructed such that all of the reflected wavelengths interfere to improve Q of FBAR 250, thereby improving its performance. In one embodiment, the alternating frame region of FBAR 250 is constructed as a DBR structure.

In addition, first frame 270 and second frame 272 are made of a different material than is second electrode 260. In this embodiment, the alternating thinner and thicker areas of the alternating frame region can be used to capture different frequency modes in the FBAR 250 in order to improve its performance, and the different material of frames 270 and 272 and second electrode 260 can be selected to achieve further performance enhancement.

In one embodiment, both the regions of the alternating frame region and of the second electrode are molybdenum (Mo). In other embodiments the alternating frame region can consist of other materials, such as metals (for example, W, Pt, Au), dielectrics (for example, Si3N4, SiO2), and piezoelectrics (for example, AlN), or combinations thereof. In yet other embodiments, the second electrode can be made of a conductive material, such as Mo or Pt, and the alternating frame regions can be made of any other material with different acoustic impedance, such as metals (for example, W, Pt, Au), dielectrics (for example, Si3N4, SiO2), and piezoelectrics (for example, AlN), or combinations thereof.

Figure 14:
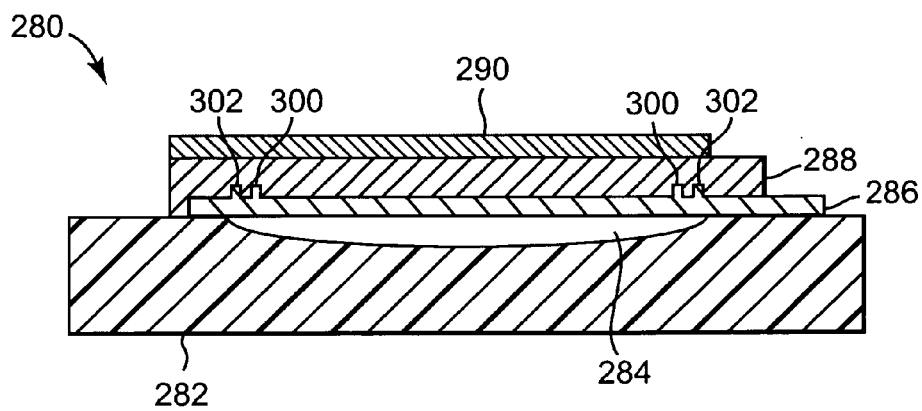
FIG. 14 illustrates a cross-sectional view of an FBAR with an alternating frame region according to another embodiment of the present invention.

FIG. 14 illustrates a cross-sectional view of an alternative FBAR 280 in accordance with one embodiment of the present invention. FBAR 280 is similar to those illustrated above, and includes substrate 282, depression 284, first electrode 286, piezoelectric (PZ) layer 288, second electrode 290 and first and second frames 300 and 302.

In one embodiment, the performance of FBAR 280 as illustrated in FIG. 14 is similar to those illustrated above, in that first and second frames 300 and 302 form an alternating frame region. In this embodiment, however, the alternating frame region is formed on a top surface of first electrode 286. By building alternating regions of different acoustic impedance with the alternating frame region (that is, frames 300 and 302 separated by regions of first electrode 286), certain wavelengths of signals within the FBAR membrane will reflect such that there is a phase change on some of the reflection. The alternating frame region is constructed such that all of the reflected wavelengths interfere to improve Q in FBAR 280, thereby improving its performance. In one embodiment, the alternating frame region of FBAR 280 is constructed as a DBR structure.

Figure 15:
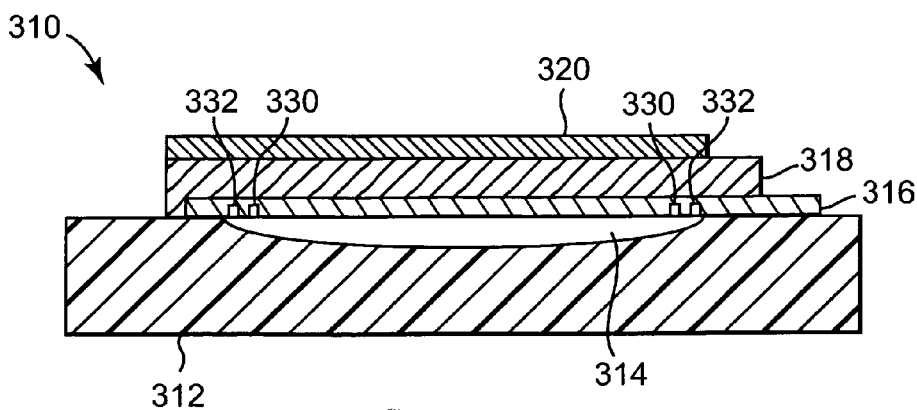
FIG. 15 illustrates a cross-sectional view of an FBAR with an alternating frame region according to another embodiment of the present invention.

FIG. 15 illustrates a cross-sectional view of an alternative FBAR 310 in accordance with one embodiment of the present invention. FBAR 310 is similar to those illustrated above, and includes substrate 312, depression 314, first electrode 316, piezoelectric (PZ) layer 318, second electrode 320 and first and second frames 330 and 332.

In one embodiment, the performance of FBAR 310 as illustrated in FIG. 15 is similar to those illustrated above, in that first and second frames 330 and 332 form an alternating frame region. In this embodiment, however, the alternating frame region is formed on a bottom surface of first electrode 316. By building alternating regions of different acoustic impedance with the alternating frame region (that is, frames 330 and 332 separated by regions of first electrode 316), certain wavelengths of signals within the FBAR membrane will reflect such that there is a phase change on some of the reflection. The alternating frame region is constructed such that all of the reflected wavelengths interfere to improve Q of FBAR 310, thereby improving its performance. In addition, frames 330 and 332 are made of a different material than first electrode 316 and selected to further improve performance. In one embodiment, the alternating frame region of FBAR 310 is constructed as a DBR structure.

Alternative alternating frame regions may be integrated with either surface of the first and second electrodes for all the above-illustrated FBARs. In addition, each can use the same or different materials for the frames and corresponding electrodes. Alternatively, the alternating frame region can even be integrated in the piezoelectric layer.

For each of the above-illustrated cross-sectional views of the various FBAR embodiments, contacts are not illustrated in the Figures, but are typically added to each of the first and second electrodes. Also, an optional passivation layer is not illustrated in the Figures, but is typically used to cover each of the second electrodes. In addition, each of the first electrodes, PZ layers, and second electrodes collectively form an FBAR membrane, which is illustrated in each case placed over a depression. In each case, the FBAR membrane can also be placed over an electrode-acoustic mirror interface using an SMR design in accordance with the present invention.

Figure 16A:
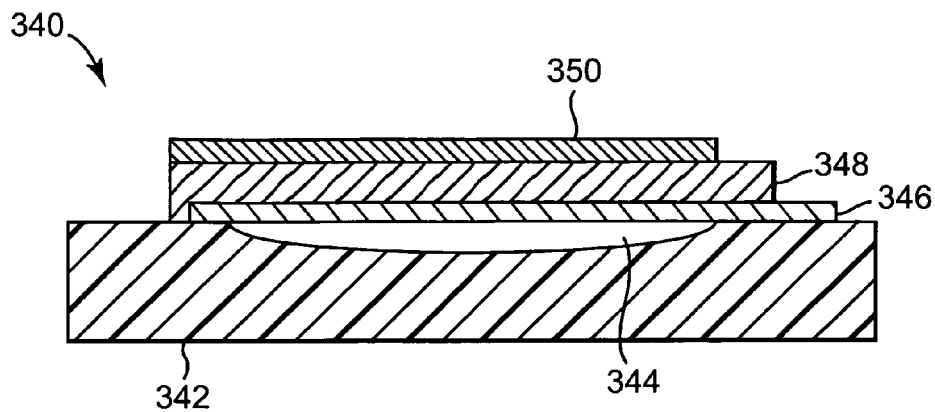
FIGS. 16A-16C are cross-sectional views illustrating various stages of fabrication of an FBAR with an alternating frame region according to one embodiment of the present invention.
Figure 16B:
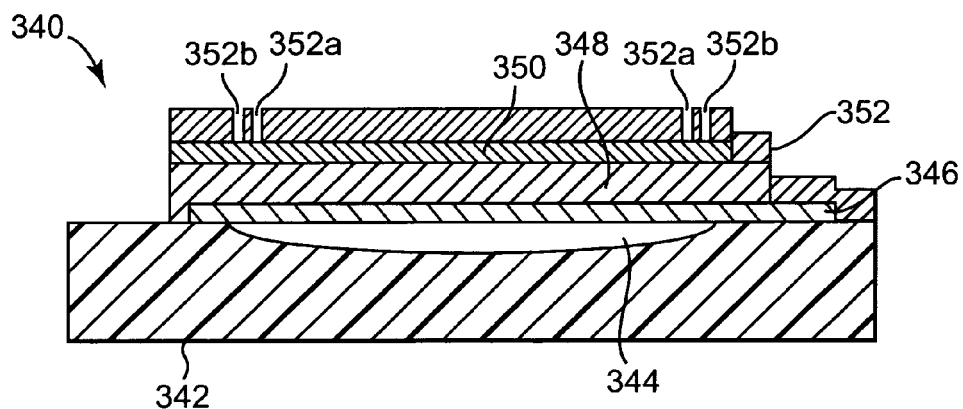
Figure 16C:
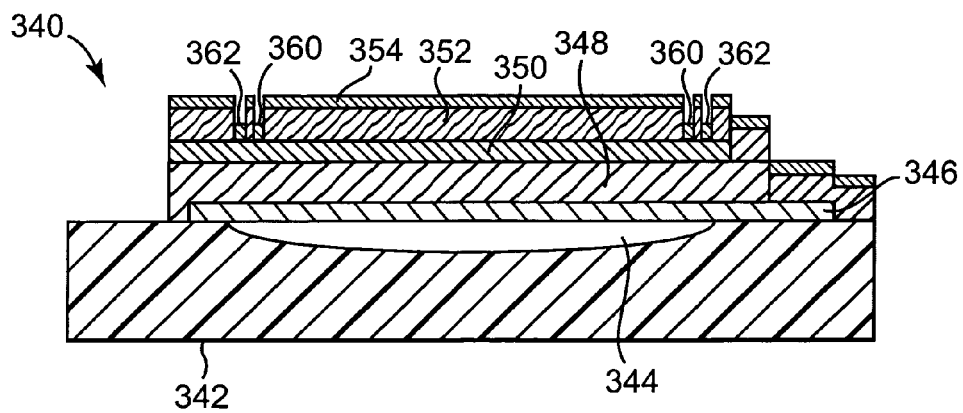

Each of the above-illustrated FBARs can be fabricated in a variety of ways consistent with the present invention. FIGS. 16A-16C are cross-sectional views illustrating various intermediate stages of fabrication of an FBAR 340 according to one embodiment of the present invention. Analogous steps can be applied to manufacture each of the above-described FBARs.

FBAR 340 is similar to those illustrated above, and includes substrate 342, depression 344, first electrode 346, piezoelectric (PZ) layer 348, and second electrode 350, which collectively form an FBAR membrane. FIG. 16A illustrates FBAR 340 prior to formation of any frame, alternating frame region, or DBR structure.

FIG. 16B illustrates FBAR 340 with a photo mask 352 deposited over the FBAR membrane. Photo mask 352 is used to pattern mask regions 352a and 352b using a lift-off process. Mask regions 352a and 352b are effectively recessed in the photo mask 352 such that they are then used in the formation of frames in the fabrication of the alternating frame structure in subsequent steps.

FIG. 16C illustrates FBAR 340 after additional electrode material metal 354 is deposited, but before the lift-off process. In this step, first and second frames 360 and 362 are illustrated formed in mask regions 352a and 352b. A lift off process then removes photo mask 352 and all metal 354 that is on photo mask 352. After the lift-off process, where photo mask 352 is removed and the structure cleaned, an FBAR such as FBAR 40 illustrate in FIG. 3, is left behind. Contacts are then added to the electrodes and, in some embodiments, the FBAR may additionally utilize at least one passivation layer.

An alternating frame region on the bottom electrode may be constructed similarly. In addition, rather than using additional electrode material metal 354 in FIG. 16C, a different material can be used in that step so that the electrode and alternating frame structure are made of different materials.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An acoustic resonator comprising:
a first electrode;
a layer of piezoelectric material adjacent the first electrode;
a second electrode adjacent the layer of piezoelectric material, the second electrode having an outer perimeter; and
an alternating frame region configured on the second electrode adjacent the outer perimeter;
wherein the alternating frame region further comprises a first region having a first acoustic impedance and a second region having a second acoustic impedance, the first and second acoustic impedances being different such that certain wavelengths of signals within the acoustic resonator reflect and interfere to improve Q.

2. The acoustic resonator of claim 1, wherein the alternating frame region comprises at least a first raised frame and a second raised frame on the second electrode, the first and second raised frames being spaced apart from each other.

3. The acoustic resonator of claim 2, wherein the alternating frame region is a distributed Bragg reflector.

4. The acoustic resonator of claim 2, wherein the first and second spaced apart raised frames are the same width.

5. The acoustic resonator of claim 2, wherein the first frame is wider than the second frame.

6. The acoustic resonator of claim 2, wherein the first frame is thicker than the second electrode.

7. The acoustic resonator of claim 2, further including a recessed region inside the first and second raised frames.

8. An acoustic resonator comprising:
a substrate;
a first electrode adjacent the substrate, wherein the first electrode has an outer perimeter;
a piezoelectric layer adjacent the first electrode;
a second electrode adjacent the piezoelectric layer, wherein the second electrode has an outer perimeter; and
an alternating frame region on one of the first and second electrodes;
wherein the alternating frame region includes at least one raised frame adjacent at least one relatively recessed region;
wherein the alternating frame region is a distributed Bragg reflector.

9. An acoustic resonator comprising:
a substrate;
a first electrode adjacent the substrate, wherein the first electrode has an outer perimeter;
a piezoelectric layer adjacent the first electrode;
a second electrode adjacent the piezoelectric layer, wherein the second electrode has an outer perimeter; and
an alternating frame region on one of the first and second electrodes;
wherein a depression is formed in the substrate and wherein the depression has a depression perimeter;
wherein the alternating frame region is outside the depression perimeter adjacent the outer perimeter of the second electrode.

10. An acoustic resonator comprising:
a substrate;
a first electrode adjacent the substrate, wherein the first electrode has an outer perimeter;
a piezoelectric layer adjacent the first electrode;
a second electrode adjacent the piezoelectric layer;
wherein the second electrode has an outer perimeter; and
an alternating frame region on one of the first and second electrodes;
wherein a depression is formed in the substrate and wherein the depression has a depression perimeter;
wherein the alternating frame region overlaps the depression perimeter.

11. An acoustic resonator comprising:
a substrate;
a first electrode adjacent the substrate, wherein the first electrode has an outer perimeter;
a piezoelectric layer adjacent the first electrode;

a second electrode adjacent the piezoelectric layer; wherein the second electrode has an outer perimeter; and an alternating frame region on one of the first and second electrodes;

wherein a depression is formed in the substrate and wherein the depression has a depression perimeter;

wherein the alternating frame region is inside the depression perimeter.

12. An acoustic resonator comprising:

a substrate;

a first electrode adjacent the substrate;

a layer of piezoelectric material adjacent the first electrode;

a second electrode adjacent the layer of piezoelectric material, wherein the first electrode, the layer of piezoelectric material and the second electrode together form an acoustic membrane having an outer edge and a center; and an alternating frame region adjacent the outer edge of the acoustic membrane, which includes a plurality of raised frames on the second electrode, each of the plurality of raised frames being spaced apart, wherein the alternating frame region traps lateral modes within the acoustic membrane.

13. The acoustic resonator of claim 12, wherein the alternating frame region further comprises a first region having a first acoustic impedance and a second having a second acoustic impedance, the first and second acoustic impedances being different such that certain wavelengths of signals within the acoustic resonator reflect and interfere to improve Q.

14. The acoustic resonator of claim 12, wherein at least one of the raised frames on the second electrode stiffens the edge of the acoustic membrane thereby trapping modes within the resonator.

* * * * *